United States Patent [19]
Slocum

[11] Patent Number: 6,097,201
[45] Date of Patent: Aug. 1, 2000

[54] SYSTEM TO SIMULTANEOUSLY TEST TRAYS OF INTEGRATED CIRCUIT PACKAGES

[75] Inventor: Alexander H. Slocum, Bow, N.H.

[73] Assignee: Kinetrix, Inc., Bedford, N.H.

[21] Appl. No.: 08/962,605

[22] Filed: Oct. 31, 1997

[51] Int. Cl.[7] .................................................. G01R 31/02
[52] U.S. Cl. ...................... 324/760; 324/158.1
[58] Field of Search ................... 324/760, 537, 324/754, 765, 158.1; 439/68, 72

[56]  References Cited

U.S. PATENT DOCUMENTS

| | | | |
|---|---|---|---|
| 3,165,674 | 1/1965 | Swan | 324/537 |
| 4,099,120 | 7/1978 | Aksu | 324/754 |
| 4,222,737 | 9/1980 | Jones | 432/253 |
| 4,437,718 | 3/1984 | Selinko | 439/72 |
| 4,695,707 | 9/1987 | Young | 219/392 |
| 4,912,400 | 3/1990 | Plante | 324/754 |
| 4,926,118 | 5/1990 | O'Connor et al. | 324/158 F |
| 4,949,031 | 8/1990 | Szasz et al. | 324/158 F |
| 4,968,931 | 11/1990 | Littlebury et al. | 324/760 |
| 5,021,733 | 6/1991 | Ebihara et al. | 324/760 |
| 5,126,656 | 6/1992 | Jones | 324/158 F |
| 5,131,535 | 7/1992 | O'Connor et al. | 206/329 |
| 5,150,797 | 9/1992 | Shibata | 209/573 |
| 5,184,068 | 2/1993 | Twigg et al. | 324/158 F |
| 5,190,431 | 3/1993 | Klug et al. | 414/417 |
| 5,219,765 | 6/1993 | Yoshida et al. | 324/754 |
| 5,227,717 | 7/1993 | Tsurishima et al. | 324/158 F |
| 5,247,248 | 9/1993 | Fukunaga | 324/760 |
| 5,290,134 | 3/1994 | Baba | 414/404 |
| 5,307,011 | 4/1994 | Tani | 324/158 F |
| 5,313,156 | 5/1994 | Klug et al. | 324/158 F |
| 5,528,159 | 6/1996 | Charlton et al. | 324/758 |
| 5,572,144 | 11/1996 | Davidson et al. | 324/754 |
| 5,758,776 | 6/1998 | Slocum et al. | 206/714 |
| 5,773,986 | 6/1998 | Thompson et al. | 324/760 |

FOREIGN PATENT DOCUMENTS

| | | |
|---|---|---|
| 61-290373 | of 0000 | Japan . |
| 93/02952 | 2/1993 | WIPO . |

*Primary Examiner*—Ernest Karlsen
*Attorney, Agent, or Firm*—Edmund J. Walsh

[57]  ABSTRACT

A test system for testing numerous parts simultaneously. A stack of test boards is provided in a test chamber. Each of the test boards has a region of contactors on it. To perform a test, trays are inserted between the boards in the stack and aligned with the regions of contactors. A mechanism is then activated to press the trays towards the boards, thereby making contact between the contactors and devices on the trays. The test system is described in conjunction with a burn-in oven. Processing time is reduced because individual handling of chips is significantly reduced.

20 Claims, 9 Drawing Sheets

SYSTEM TO SIMULTANEOUSLY TEST TRAYS OF INTEGRATED CIRCUIT PACKAGES

This invention relates generally to the manufacture of integrated circuits and more specifically to testing integrated circuits.

Semiconductors are typically tested several times during their manufacture. One type of test is called "burn-in testing." During burn-in testing, integrated circuits (or "chips") are placed in an oven which heats the chips. The chips are left in the oven for several hours, sometimes eight hours or longer. Periodically during the time while the chips are in the oven, electrical signals are applied to the chips to verify that they are operating correctly. The purpose of burn-in testing is to accelerate the failure of defective chips so that only high quality chips are shipped to customers.

In order that burn-in testing be economically performed, many chips are placed in a burn-in oven at one time. The chips are loaded onto burn-in boards, each of which can hold many chips at a time. The burn-in board is a printed circuit board that has numerous sockets, each of which can hold one chip. The sockets are connected to connectors on the board through traces on the burn-in board. The connectors mate with complimentary connectors inside the burn-in oven so that electrical test signals can be routed to each chip.

The connectors on the burn-in boards and in the burn-in oven allow the burn-in boards to be removed from the oven for loading and unloading of chips from the oven. Loading of the chips into the burn-in board is generally automated with a robotic device called a burn-in board loader. The burn-in board loader typically includes a pick and place mechanism that picks up chips from a standard sized JEDEC carrying tray and places the chips into sockets on the burn-in board.

The boards are then placed into the oven for a test cycle. To test many chips simultaneously, several burn-in boards are loaded into the burn-in oven. Generally, the trays are stacked one on top of another so that many trays can fit inside the oven.

Once the test is completed, the burn-in boards are removed from the oven. The chips are then removed from the sockets on the burn-in board and replaced in JEDEC carrying trays.

One drawback of this approach is that the loading and unloading operations reduces the efficiency of the process and increases cost. Moving the chips between the JEDEC trays and the burn-in boards takes time and requires investment in equipment. Likewise, moving the burn-in boards into and out of the oven takes time and requires investment in equipment. Further, it is undesirable to move the boards in and out of the oven because, each time a board is inserted or removed, the connectors on the board and the mating connector in the oven are exercised. Connectors tend to wear if they are exercised a lot, which could lead to erroneous results or require that the connectors be replaced frequently.

SUMMARY OF THE INVENTION

With the foregoing background in mind, it is an object of the invention to provide an efficient burn-in tester.

It is also an object to provide a test system that allows multiple trays of integrated circuits to be quickly loaded and unloaded.

It is also an object to allow multiple trays of chips to be loaded into a tester without individual handling of the chips.

The foregoing and other objects are achieved with a tester that has a plurality of boards, each with an array of contactors. A tray positioning device inserts trays of integrated circuits into the tester. The trays are then pressed into the board, allowing the chips to make contact with the boards through the contactors.

In a preferred embodiment, the chips are pressed into the board using an inflatable bladder. In one embodiment, the bladder is inflated with fluid. The fluid may be of elevated temperature and circulated through the bladder to raise the temperature of the chips.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
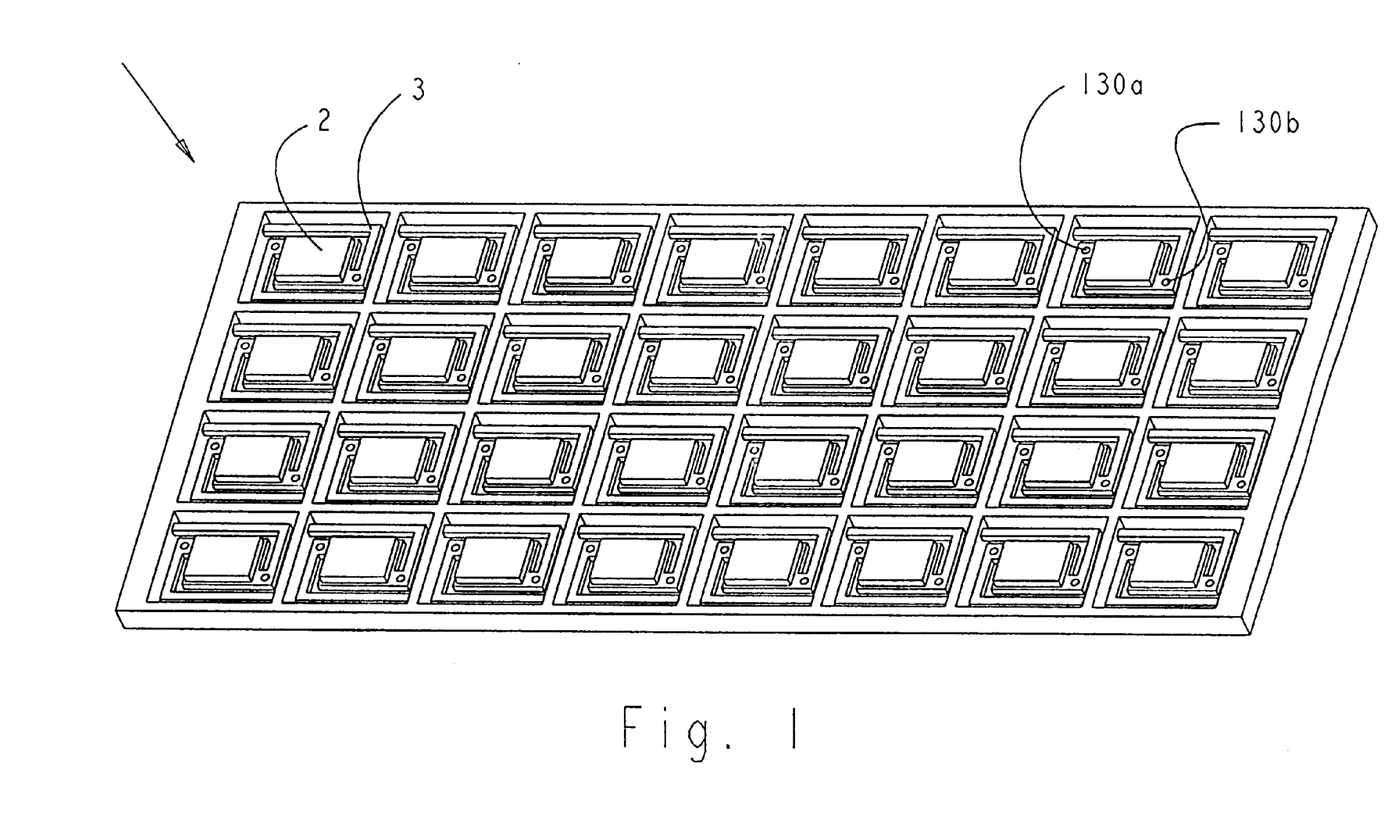
FIG. 1 is an isometric view of a tray to be used with the test system of the invention.

FIG. 1 shows a tray 1 for carrying integrated circuit chips 2 that is useful in conjunction with the test system of the invention. Tray 1 carries a plurality of integrated circuit chips 2. Each chip 2 is supported on a platform (not numbered) that is held by a pair of compliant arms 3. Compliant arms 3 allows all of the chips 2 to aligned with a contactor despite imprecision in the position of tray 1 relative to the contactors. Tray 1 is as described in co-pending U.S. patent application Ser. No. 08/653,588 entitled Integrated Circuit Tray With Flexural Bearings, which is hereby incorporated by reference.

Each of the platforms (not numbered) in tray 1 includes alignment holes 130a and 130b. Alignment holes 130a and 130b engage alignment pins 30a and 30b (FIG. 2).

Figure 2:
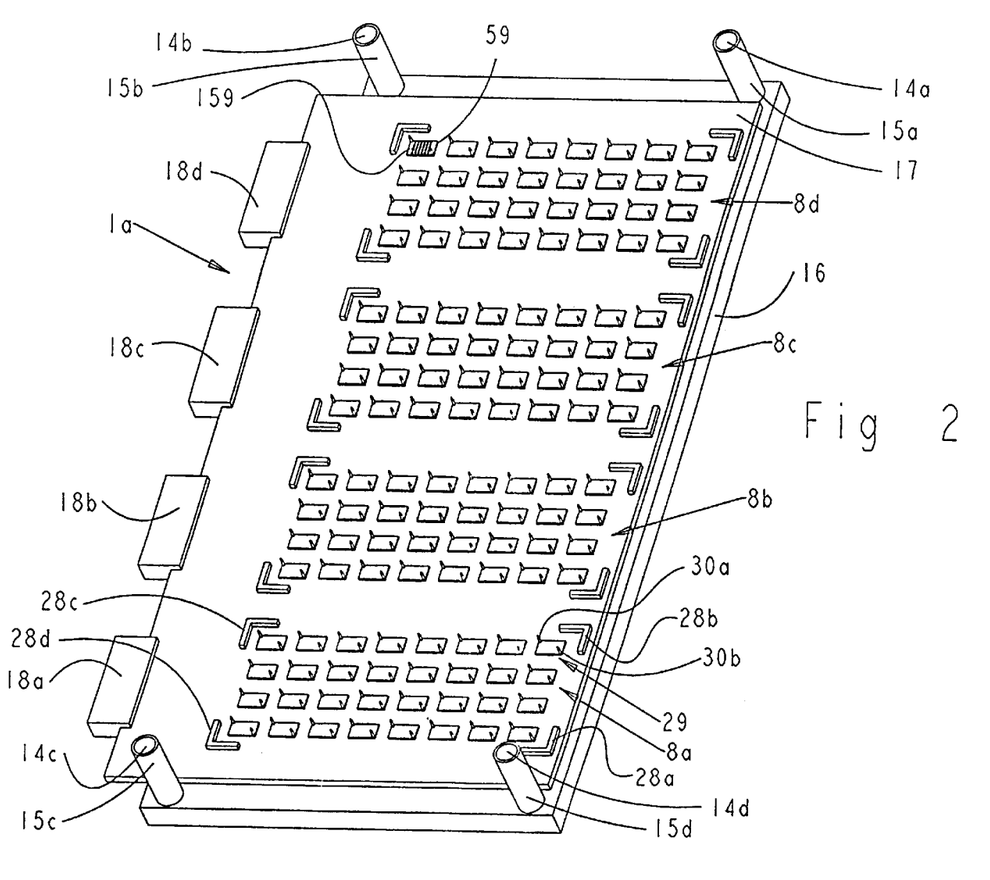
FIG. 2 is an isometric view of a board to be used in the test system of the invention.

FIG. 2 shows a testing board 16, which includes a printed circuit board 17 attached to a stiffener (not numbered). Board 16 has four regions 8a, 8b, 8c and 8d. Each of the regions 8a . . . 8d is sized to receive a tray 1 of semiconductor chips. The regions 8a . . . 8d each contains an array of contactors 59 (only one of which is shown for clarity). The array contains the same number of contactors as there are chips in a tray 1. The contactors 59 are positioned to generally line up with the platforms (not numbered) of tray 1 that hold the chips. A pair of alignment pins 30a and 30b is positioned next to each contactor 59.

Course alignment of a tray 1 to a region 8a . . . 8d is made with stops 28a . . . 28d. Stops 28a . . . 28d are positioned to bracket each of the regions 8a . . . 8d with an area the size of a tray 1. A tray 1 is positioned relative to a region 8a . . . 8d by resting it against a subset of the stops 28a . . . 28d. With this course positioning, the pairs of alignment pins 30a and 30b will engage a pair of alignment holes 130a and 130b on a platform (not numbered) holding a chip 2. Compliant arms 3 allow the platform to be pushed by the alignment pins 30a and 30b into the desired position. In this way, each chip 2 is precisely aligned with contactor 59.

Each contactor 59 has a plurality of electrical contacts 159. Conductive leads (not shown) on chips 2 make contact with these electrical contacts 159. Preferably, each contactor 59 has a design similar to what is disclosed in U.S. patent application Ser. No. 08/832,303 entitled Flexible Shielded Laminate Beam For Electrical Contacts And The Like And Method Of Contact Operation.

Each of the electrical contacts 159 in each of the contactors 59 is connected to electrical traces (not shown) within testing board 16. Testing board 16 is a conventional printed circuit board and includes conductive traces as is known in the art. The conductive traces (not shown) run to electrical connectors 18a . . . 18d. As described below, electrical connectors 18a . . . 18d plug into mating electrical connectors inside a test chamber, thereby allowing chips 2 to be electrically connected to a semiconductor tester.

In the embodiment of FIG. 2, board 16 has posts 15a . . . 15d positioned at each of the four corners of the board. Posts 15a . . . 15d each have a hole 14a . . . 14d formed therein. Posts 15a . . . 15d and holes 14a . . . 14d allow multiple boards 16 to be stacked one on top of the other.

Figure 3:
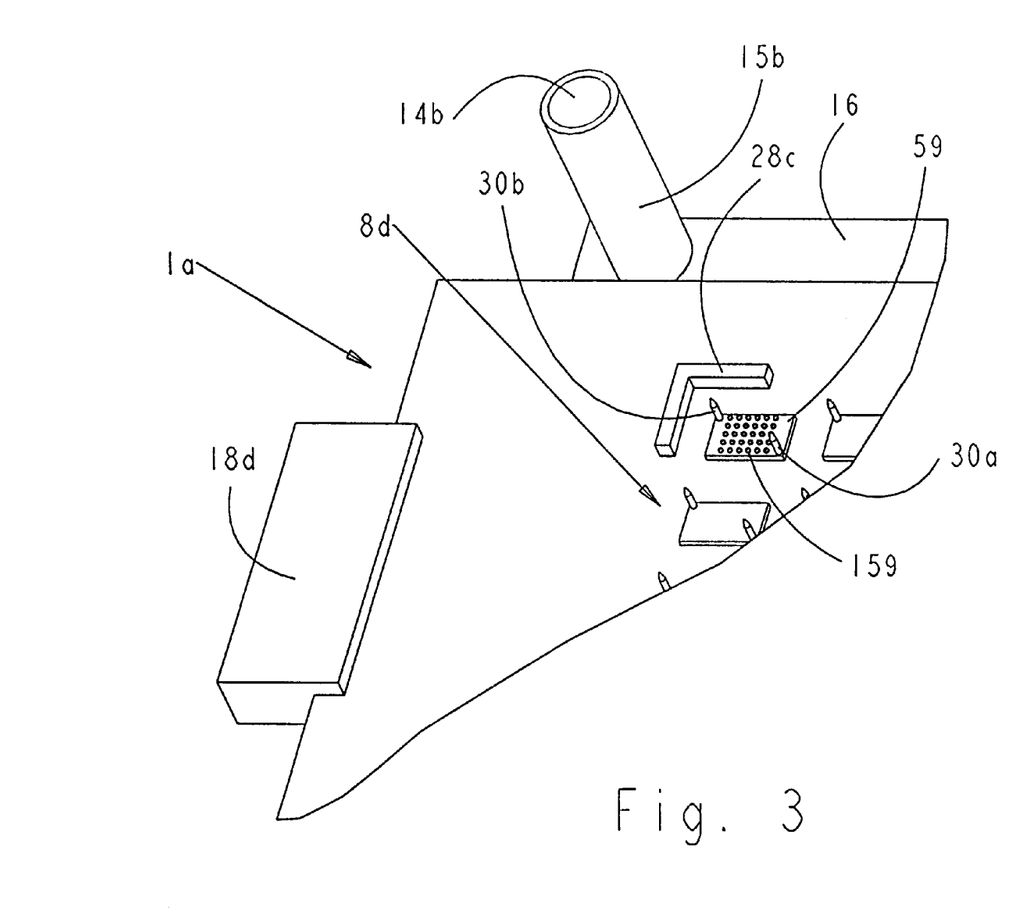
FIG. 3 is an enlarged view of a portion of the board in FIG. 2.

FIG. 3 shows one piece of board 16 cut away and enlarged.

Figure 4:
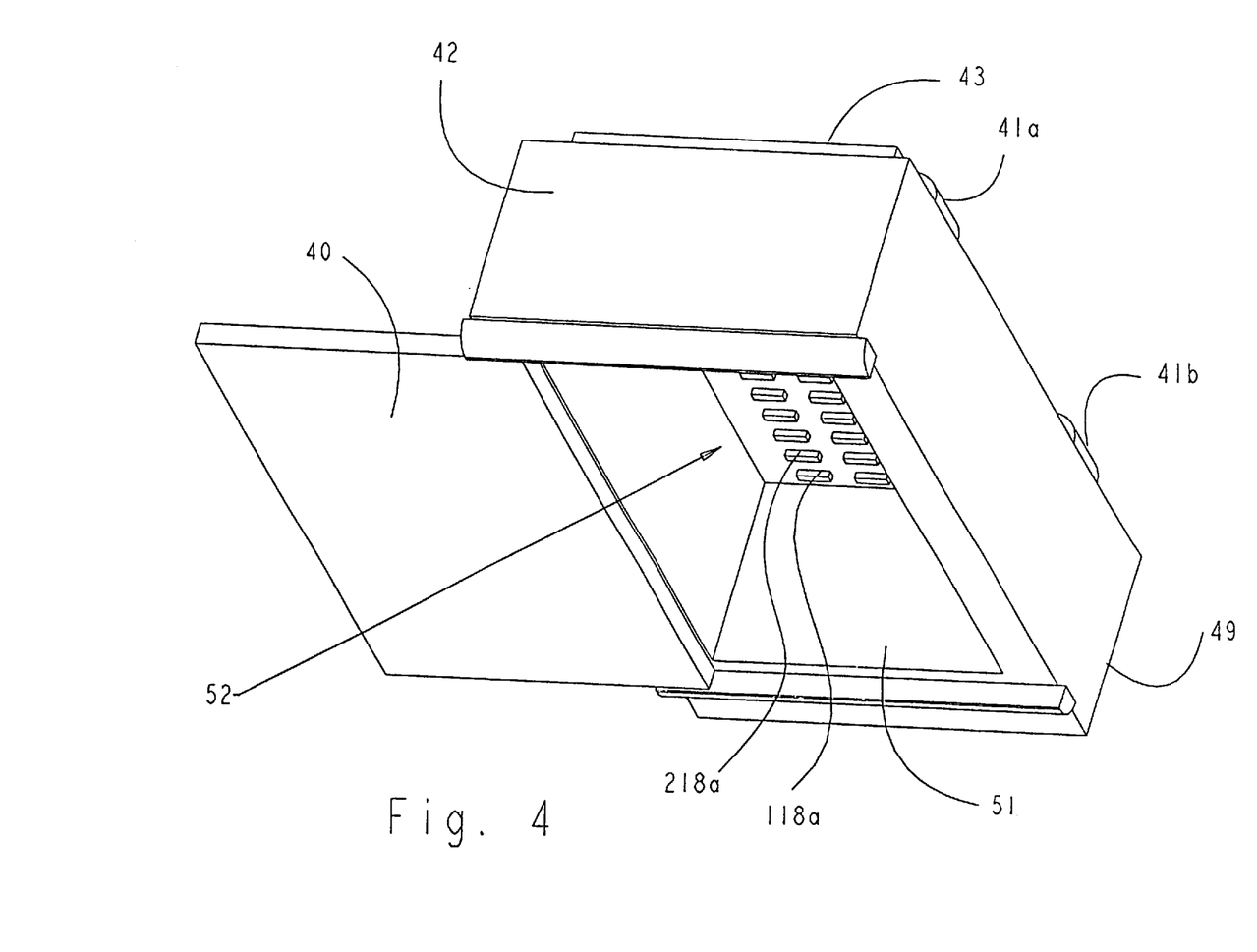
FIG. 4 is an isometric view of an oven to be used as part of a test system of the invention.

FIG. 4 shows a test chamber which receives a plurality of test boards 16. In the illustrated embodiment, the test chamber is an oven 42. Oven 42 has a central cavity 52 into which a plurality of boards 16 are placed. Connectors 18a . . . 18d on each of the boards 16 plugs into a mating connector, such as 118a or 218a. In this way, a test system (not shown) connected to oven 42 can generate and measure test signals to the plurality of chips 2 inside oven 42.

Oven 42 includes a front door 40 and a back door 43. Each of the doors is mounted on hinges, such as hinges 41a and 41b. In use, boards 18 will be inserted into cavity 52. Back door 43 will generally remain closed. It is provided only for service.

Boards 16 will remain installed inside cavity 52. Door 40 will be opened to insert or remove trays 1 from oven 42. Once a set of trays 1 have been inserted into oven 42, door 40 will be closed and oven 42 will be controlled to retain the desired test temperature.

Figure 5:
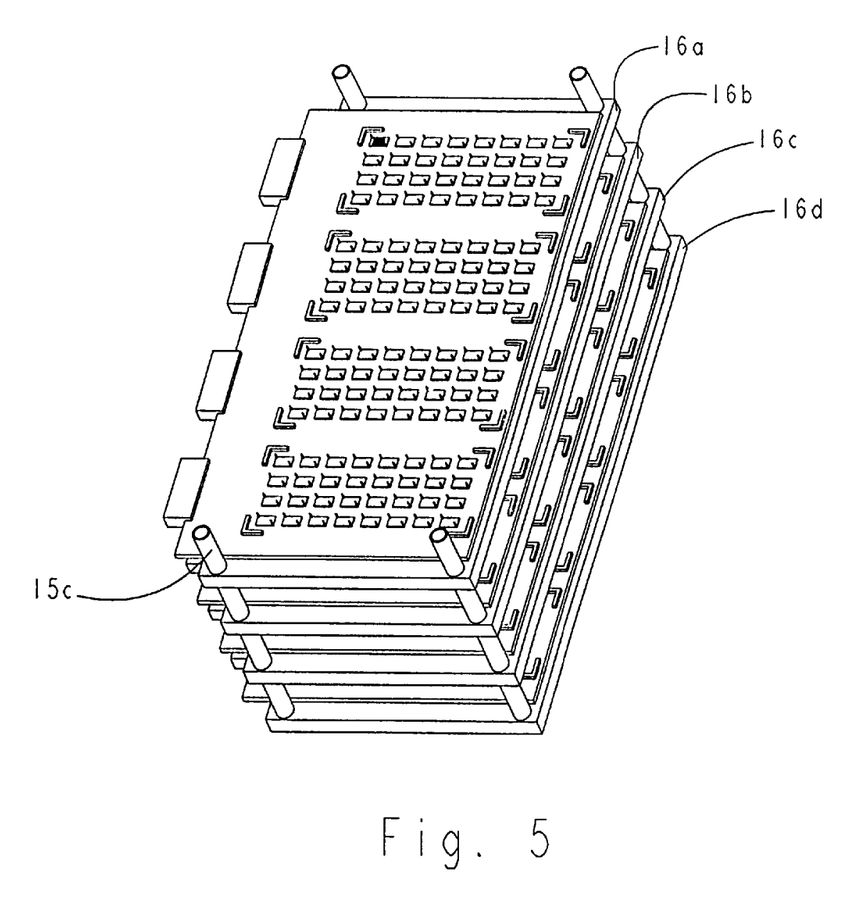
FIG. 5 is an isometric view of a plurality of boards to illustrate their positioning within a test system according to the invention.

FIG. 5 shows a stack of boards 16a . . . 16d as it would appear inside oven 42. Posts, such as 15c, space the boards a fixed distance apart. Board 16d would rest on bottom shelf 51 (FIG. 4) of oven 42. Some mechanism to hold the trays together is desirable. The trays might be latched one to the other. Alternatively, a plunger or other mechanism might press down on the entire stack to hold them together.

Figure 6:
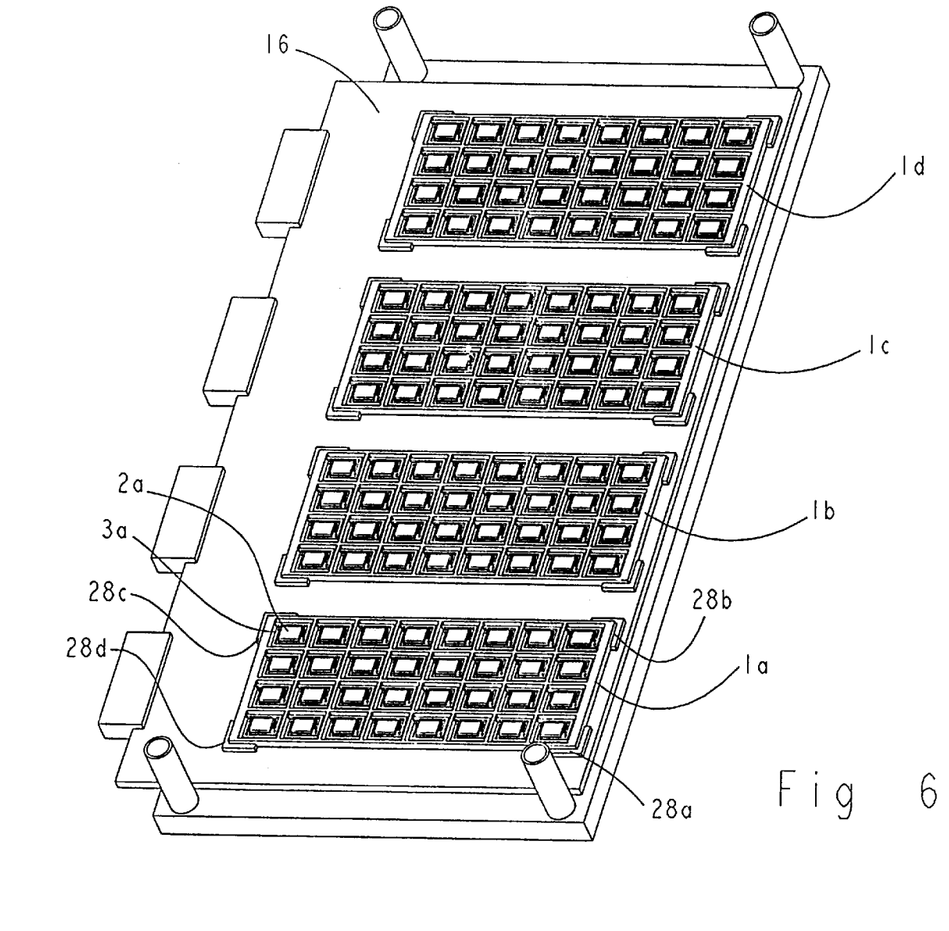
FIG. 6 is an isometric view if a board with trays of integrated circuit chips mounted thereon.

FIG. 6 shows a board 16 with trays 1a . . . 1d loaded into it. Each of the trays 1a . . . 1d is coarsely positioned by stops 28a . . . 28d. However, as described above, the compliant arms, such as 3a, allow each chip in each tray to be precisely aligned with a contactor 59 (FIG. 2) with fine alignment pins 30a and 30b that pierce alignment holes 130a and 130b.

Figure 7:
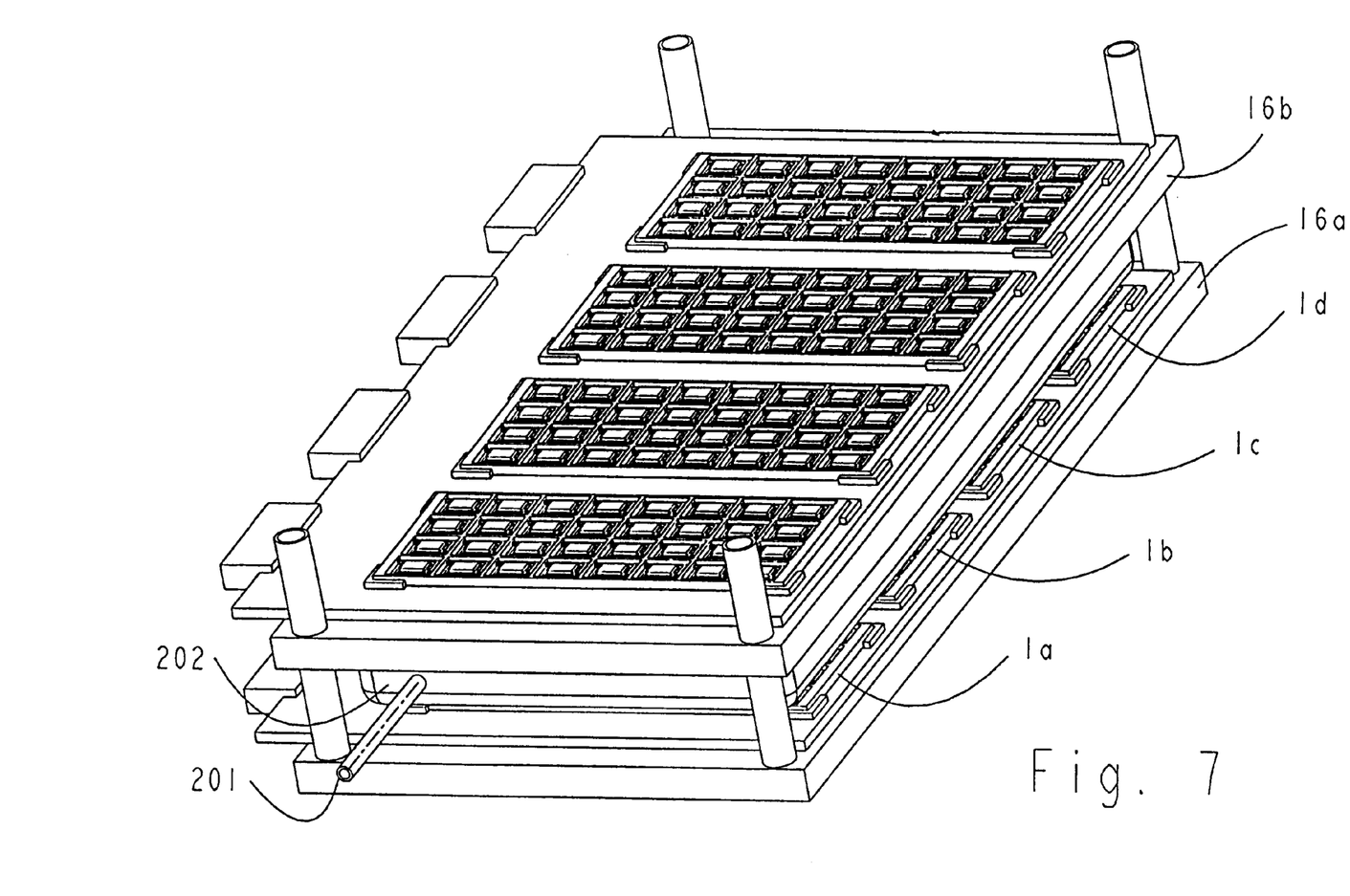
FIG. 7 is an isometric view of boards with trays of chips thereon and a mechanism for applying force to the chips.

FIG. 7 shows a stack of boards, such as 16a and 16b, as it would appear inside oven 42. However, to ensure that chips 2 (FIG. 1) make good electrical contact with contactors 59 (FIG. 2), downward force must be applied to the chips to press them into the contactors. For good electrical contact, the force applied to each chip should be as uniform as possible. In the embodiment of FIG. 7, that force is supplied by bladder 202.

Bladder 202 is made from a flexible, but strong, material that can withstand the heat in a burn-in oven. In a preferred embodiment, bladder 202 is made from heat resistant silicone.

Bladder 202 is inflated through inlet 201. In the illustrated embodiment, bladder 202 is inflated with air. However, bladder 202 might also be filled with liquid or other fluid. In one embodiment, heated fluid is circulated through bladder 202. The heated fluid serves as the source of heat for chips 102 being tested. To circulate fluid through bladder 202, an outlet is preferably provided in addition to inlet 201.

Figure 8:
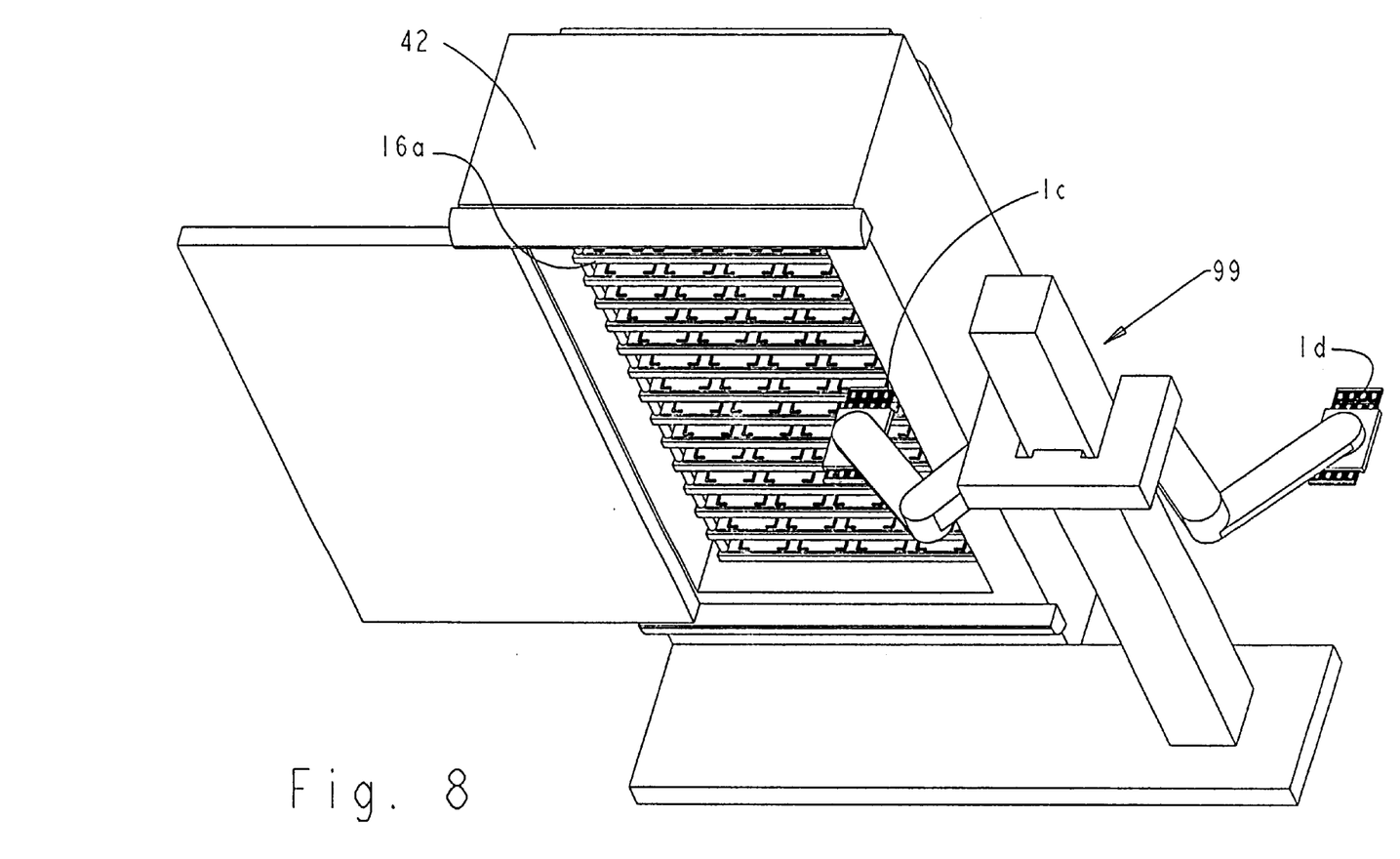
FIG. 8 is an isometric view illustrating a mechanism that can be used to load trays into the testing system of the invention.

Turning to FIG. 8, the test chamber portion of the test system is shown in operation. Oven 42 is shown with a stack of boards 16 installed. A robot 99 picks up an entire tray 1c of chips and inserts it into one of the regions 8a . . . 8d (FIG. 2) of one of the boards 16. As in a conventional semiconductor processing operation, trays of chips are generally moved from one work station to the next in magazines. Thus, robot 99 picks up trays from the input magazine (not shown) and inserts it into oven 42. Robot 99 then picks up the next tray from the input magazine and inserts that tray into the next region inside oven 42. The process continues in this fashion until oven 42 is full.

Door 40 is closed. The bladders 202 between each adjacent board 16 in the stack are inflated such that all of the chips make electrical contact with their respective contactors. At this point, electrical testing of the parts can begin. The temperature of the oven can be increased in the oven to the required testing temperature.

Once testing is completed, robot 99 removes the trays from the oven 42 and places them in an output station, such as another magazine. Another set of trays can then be loaded into oven 42 for further testing.

It is important to note that during the testing operation, boards 16 are not removed from oven 42. In addition, chips are not removed from trays 1. In this way, significant time is saved in loading and unloading the oven.

Figure 9:
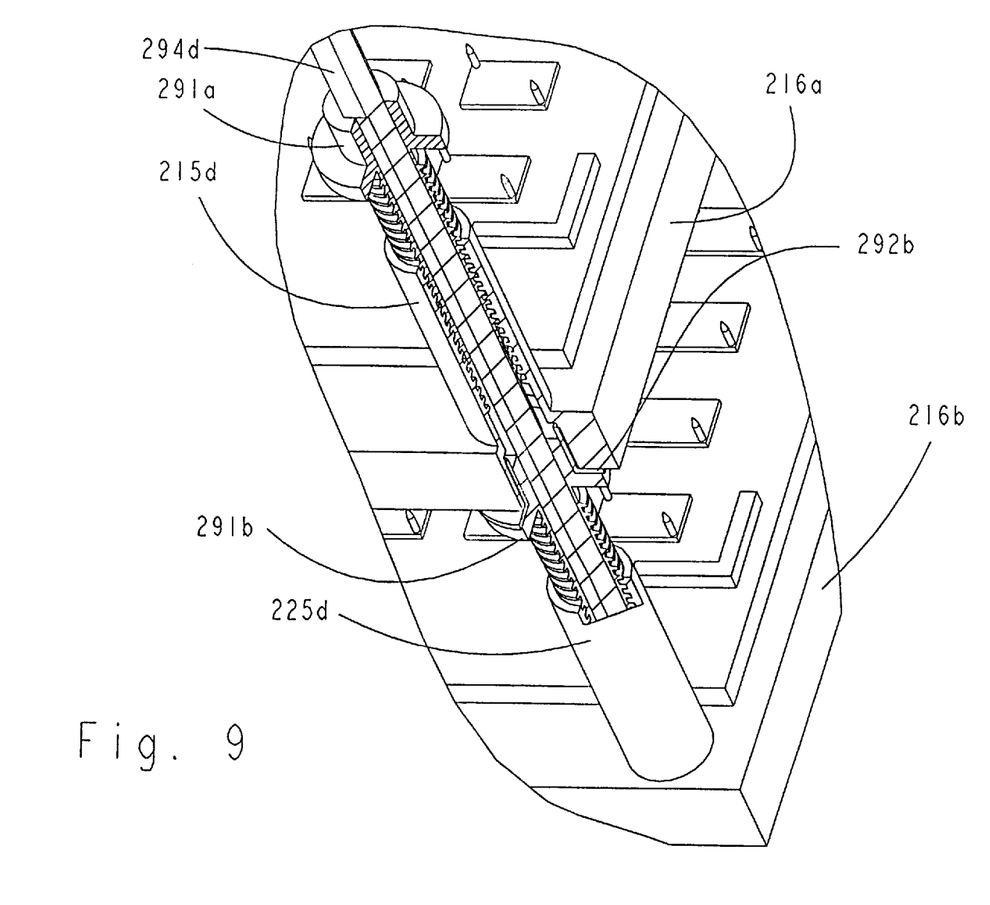
FIG. 9 is a sketch, partially cut away, of an alternative mechanism for applying force to the chips.

Having described one embodiment, numerous alternative embodiments or variations might be made. For example, FIG. 9 shows an alternative embodiment of a mechanism to provide pressure on the chips 2 to force them into contactors 59. Boards 216a and 216b are similar to boards 16. However, posts 15 are replaced by posts 225d, which are internally threaded. A threaded shaft 294d passes through each of the posts 225d. A bearing system 291a and 291b allows shaft 294d to pass through each board 216a and 216b and rotate.

When threaded shaft 294d rotates, threaded posts, such as 215d and 225d, will be driven together. If a tray of chips is inserted between the trays, it will be pressed down into the contactors on the lower board. Preferably, a compliant backing will be included on each board to ensure each chip receives the appropriate force.

Also, it should be appreciated that the specific materials described are illustrative rather than limiting. Bladder 202 might be made from sheets of polyurethane or plastic bonded to a plastic frame. Multiple layers might be used to improve puncture resistance.

Bladder 202 might be replaced by any sort of compliant mechanism that would provide the required amount of force uniformly to each chip. For example, elastomer blocks might be mounted to the underside of each board 16 to press down on the chips below. Alternatively, spring biased members might be employed.

Also, the invention is described in terms of a burn-in tester. The invention might equally well be used in any system in which many chips are tested simultaneously. The invention is most useful when multiple trays of chips are tested simultaneously. Multiple trays would entail hundreds or even thousands of chips. Currently, such applications are limited to burn-in testers. However, memory testers are currently used to test multiple parts simultaneously, though such testers are currently limited to no more than 64 parts simultaneously. As memory tester technology improves, the invention might be used for testers other than burn in testers.

Therefore, the invention should be limited only by the spirit and scope of the appended claims.

What is claimed is:

1. A test system for semiconductor chips, comprising:
   a) a test chamber;
   b) a plurality of boards mounted in parallel in the test chamber, each having a plurality of regions, each of the regions having a plurality of contactors mounted thereon;
   c) a plurality of trays carrying a plurality of integrated circuit chips, each tray aligned with one of the regions, and each tray having a plurality of compliant regions receiving an integrated circuit chip; and
   d) a compliant mechanism disposed above each of the plurality of trays.

2. The test system of claim 1 wherein the test chamber comprises a burn-in oven.

3. The test system of claim 1 wherein the compliant mechanism comprises a plurality of bladders, each bladder mounted above one of the plurality of boards.

4. The test system of claim 3 wherein the bladder is inflated with air.

5. The test system of claim 3 wherein the bladder is inflated with fluid.

6. The test system of claim 5 wherein the bladder is inflated with circulating fluid at an elevated temperature.

7. The test system of claim 1 additionally comprising a robot positioned to insert and remove the trays into the test chamber.

8. The test system of claim 1 wherein each of the tray comprises a plurality of platforms, each adapted to hold an integrated circuit chip, and each tray further has a pair of compliant arms supporting each platform.

9. The test system of claim 1 wherein each of the boards comprises alignment features holding the plurality of trays in a stack.

10. A test system for semiconductor chips, comprising:
    a) a test chamber;
    b) a plurality of boards mounted in parallel in the test chamber, each having a plurality of regions, each of the regions having a plurality of contactors mounted thereon;
    c) a plurality of trays carrying plurality of integrated circuit chips, each try aligned with one of the regions; and
    d) a plurality of bladders, each having a fluid inlet and a fluid outlet and each positioned proximate at least one tray whereby, when inflated, each bladder presses at least one tray into a board.

11. The test system of claim 10 wherein the bladders comprise fluid filled bladders having heated fluid circulating therethrough.

12. A method of operating a semiconductor tester comprising the steps of:
    a) providing a plurality of boards in a test chamber, each having a plurality of regions each with a plurality of contactors thereon;
    b) providing a plurality of trays in the test chamber, each tray carrying a plurality of integrated circuit chips, and aligning each of the trays with one of the regions;
    c) pressing each of the trays towards a respective region by use of a fluid filled bladder having temperature controlled fluid circulating therethrough; and
    d) conducting electrical tests on the plurality of chips in each of the plurality of trays.

13. The method of claim 12 wherein the test chamber comprises a burn in oven.

14. The method of claim 12 wherein the step of providing a plurality of trays comprises inserting the trays into the test chamber after the boards are mounted in the test chamber.

15. The method of claim 12 wherein the step of providing a plurality of trays comprises placing the plurality of trays on the plurality of boards before the boards are inserted into the test chamber.

16. The method of claim 12 wherein the step of providing a plurality of boards comprises providing a stack of boards.

17. The method of claim 16 wherein the step of pressing comprises pressing with fluid filled bladders made of heat resistant silicone.

18. The test system of claim 1 wherein each of the regions on each of the boards is bracketed by a plurality of stops.

19. The method of claim 12 wherein the step of pressing comprises pressing with a bladder made of multiple layers of film.

20. The method of claim 12 wherein the step of pressing comprises pressing with a bladder made from a film material bonded to a frame.

* * * * *